US010515692B2

(12) United States Patent
Tang et al.

(10) Patent No.: US 10,515,692 B2
(45) Date of Patent: *Dec. 24, 2019

(54) PROGRAMMING MEMORIES WITH STEPPED PROGRAMMING PULSES

(71) Applicant: MICRON TECHNOLOGY, INC., Boise, ID (US)

(72) Inventors: Qiang Tang, Cupertino, CA (US); Xiaojiang Guo, San Jose, CA (US); Ramin Ghodsi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/023,042

(22) Filed: Jun. 29, 2018

(65) Prior Publication Data
US 2018/0308543 A1 Oct. 25, 2018

Related U.S. Application Data

(63) Continuation of application No. 15/687,710, filed on Aug. 28, 2017, now Pat. No. 10,037,797, which is a (Continued)

(51) Int. Cl.
*G06F 12/00* (2006.01)
*G11C 11/56* (2006.01)
(Continued)

(52) U.S. Cl.
CPC ........ *G11C 11/5628* (2013.01); *G06F 3/0625* (2013.01); *G06F 3/0659* (2013.01); *G06F 3/0688* (2013.01); *G06F 12/0246* (2013.01); *G11C 16/0483* (2013.01); *G11C 16/12* (2013.01); *G11C 16/3459* (2013.01); *G11C 16/10* (2013.01); *G11C 16/3404* (2013.01);
(Continued)

(58) Field of Classification Search
CPC . G11C 11/5628; G11C 16/12; G11C 16/0483; G11C 16/3459; G11C 16/3404; G11C 2211/5622; G11C 16/10; G11C 2211/5621; G06F 3/0625; G06F 3/0659; G06F 12/0246; G06F 3/0688
USPC .......................................... 711/105; 365/185
See application file for complete search history.

(56) References Cited

U.S. PATENT DOCUMENTS 6,643,188 B2 11/2003 Tanaka et al.
6,888,758 B1 5/2005 Hemink et al.
(Continued)

FOREIGN PATENT DOCUMENTS

WO 2013/103504 A1 7/2013

*Primary Examiner* — Mardochee Chery
(74) *Attorney, Agent, or Firm* — Dicke, Billig & Czaja, PLLC

(57) ABSTRACT

Methods of operating a memory device applying a programming pulse having a plurality of different voltage levels to an access line coupled to a plurality of memory cells, enabling a particular memory cell of the plurality of memory cells for programming while the programming pulse has a particular voltage level of the plurality of different voltage levels, and, after enabling the particular memory cell for programming, inhibiting the particular memory cell from programming while the programming pulse has a second voltage level of the plurality of different voltage levels, different than the particular voltage level.

20 Claims, 14 Drawing Sheets

Related U.S. Application Data continuation of application No. 14/299,074, filed on Jun. 9, 2014, now Pat. No. 9,767,894.

(51) Int. Cl.
  *G06F 12/02* (2006.01)
  *G06F 3/06* (2006.01)
  *G11C 16/34* (2006.01)
  *G11C 16/04* (2006.01)
  *G11C 16/12* (2006.01)
  *G11C 16/10* (2006.01)

(52) U.S. Cl.
  CPC ............ *G11C 2211/5621* (2013.01); *G11C 2211/5622* (2013.01)

(56) References Cited

U.S. PATENT DOCUMENTS

| | | | |
|---|---|---|---|
| 7,301,812 B2 | 11/2007 | Guterman et al. | |
| 7,324,383 B2 | 1/2008 | Incarnati et al. | |
| 7,839,687 B2 | 11/2010 | Dutta et al. | |
| 7,936,599 B2 | 5/2011 | Roohparvar et al. | |
| 8,064,252 B2 | 11/2011 | Yip | |
| 2004/0066685 A1 | 4/2004 | Choi | |
| 2006/0039198 A1* | 2/2006 | Guterman | G11C 16/30 365/185.28 |
| 2006/0056239 A1 | 3/2006 | Devin | |
| 2006/0209592 A1 | 9/2006 | Li et al. | |
| 2007/0121386 A1 | 5/2007 | Ho et al. | |
| 2008/0175047 A1 | 7/2008 | Im | |
| 2010/0238731 A1 | 9/2010 | Suh et al. | |
| 2011/0013460 A1 | 1/2011 | Dong et al. | |
| 2011/0019486 A1 | 1/2011 | Jang et al. | |
| 2011/0058424 A1 | 3/2011 | Goda et al. | |
| 2011/0157972 A1 | 6/2011 | Pasotti et al. | |
| 2011/0157977 A1 | 6/2011 | Pasotti et al. | |
| 2011/0267895 A1* | 11/2011 | Lee | G11C 11/5628 365/185.25 |
| 2013/0163346 A1 | 6/2013 | Shen | |
| 2013/0308365 A1* | 11/2013 | Smith | G11C 17/18 365/96 |
| 2014/0126298 A1* | 5/2014 | Jeon | G11C 11/5635 365/185.24 |
| 2014/0254288 A1 | 9/2014 | Achter et al. | |
| 2014/0321215 A1* | 10/2014 | Sakui | G11C 16/12 365/185.24 |
| 2014/0369134 A1* | 12/2014 | Baik | G11C 16/3459 365/185.22 |
| 2015/0023103 A1* | 1/2015 | Aritome | G11C 16/04 365/185.12 |
| 2015/0063047 A1* | 3/2015 | Choi | G11C 5/148 365/203 |

* cited by examiner

US 10,515,692 B2

PROGRAMMING MEMORIES WITH STEPPED PROGRAMMING PULSES

RELATED APPLICATION

This Application is a Continuation of U.S. application Ser. No. 15/687,710, titled "PROGRAMMING MEMORIES WITH STEPPED PROGRAMMING PULSES," filed Aug. 28, 2017, now U.S. Pat. No. 10,037,797 issued on Jul. 31, 2018, which is a Continuation of U.S. application Ser. No. 14/299,074, titled "PROGRAMMING MEMORIES WITH STEPPED PROGRAMMING PULSES," filed Jun. 9, 2014, now U.S. Pat. No. 9,767,894 issued on Sep. 19, 2017 which are commonly assigned and incorporated herein by reference.

TECHNICAL FIELD

The present embodiments relate generally to memory devices and a particular embodiment relates to programming in memory devices.

BACKGROUND

Memory devices (which are sometimes referred to herein as "memories") are typically provided as internal, semiconductor, integrated circuits in computers or other electronic systems. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Common electronic systems that utilize flash memory devices include, but are not limited to, personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a string of memory cells is coupled in parallel with each memory cell coupled to a data line, such as those typically referred to as digit (e.g., bit) lines. In NAND flash architecture, a string of memory cells is coupled in series with only the first memory cell of the string coupled to a bit line.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory.

Programming in memories is typically accomplished by applying a plurality of programming pulses, separated by verify pulses, to program each memory cell of a selected group of memory cells to a respective target data state (which may be an interim or final data state). With such a scheme, the programming pulses are applied to access lines, such as those typically referred to as word lines, for selected cells. After each programming pulse, a verify pulse of plurality of verify pulses are used to verify the programming of the selected cells. Current programming uses many programming pulses in an incremental step pulse programming scheme, where each programming pulse is a single pulse that moves cell threshold voltage by a certain amount. In a four level MLC, there are four potential final data states. Before each programming pulse, word lines are precharged, and after each programming pulse, the word lines are discharged. This uses high voltage, which is at a premium as memory supply voltages shrink, and consumes power and time.

For the reasons stated above and for other reasons that will become apparent to those skilled in the art upon reading and understanding the present specification, there is a need in the art for improved programming in memories.

DETAILED DESCRIPTION

Figure 1:
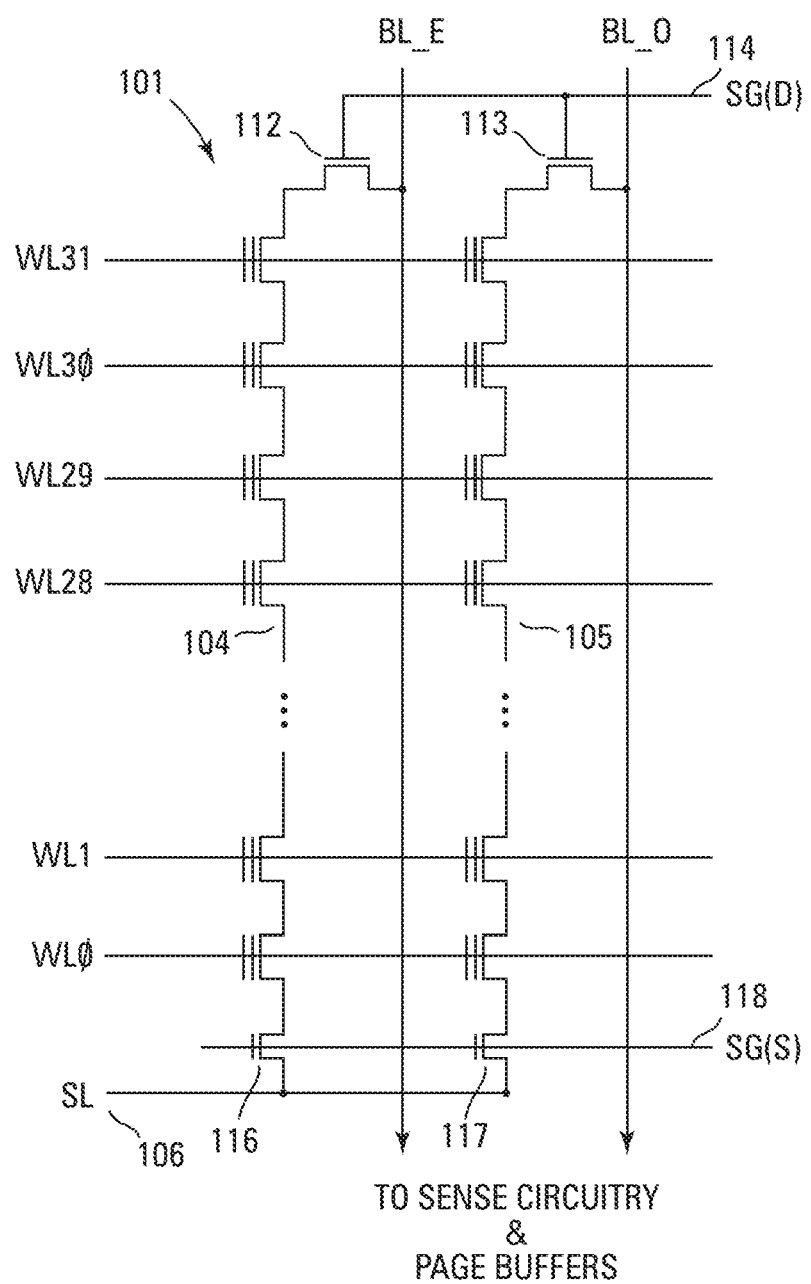
FIG. 1 is a schematic diagram of one embodiment of a portion of a NAND architecture memory array.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Non-volatile memory can utilize different architectures including NOR and NAND. The architecture designation is derived from the logic used to read the devices. In NOR architecture, a logical column of memory cells is coupled in parallel with each memory cell coupled to a data line, such as those typically referred to as bit lines. In NAND architecture, a column of memory cells is coupled in series with only the first memory cell of the column coupled to a bit line.

FIG. 1 illustrates a schematic diagram of one embodiment of a portion of a NAND architecture memory array 101 comprising series strings of non-volatile memory cells.

The memory array 101 comprises an array of non-volatile memory cells (e.g., floating gate) arranged in columns such as series strings 104, 105. Each of the cells is coupled drain to source in each series string 104, 105. An access line (e.g., word line) WL0-WL31 that spans across multiple series strings 104, 105 is coupled to the control gates of each memory cell in a row in order to bias the control gates of the memory cells in the row. Data lines, such as even/odd bit lines BL_E, BL_O, are coupled to the series strings and eventually coupled to sense circuitry that detect and store the state of each cell by sensing current or voltage on a selected bit line.

Each series string 104, 105 of memory cells is coupled to a source line 106 by a source select gate 116, 117 (e.g., transistor) and to an individual bit line BL_E, BL_O by a drain select gate 112, 113 (e.g., transistor). The source select gates 116, 117 are controlled by a source select gate control line SG(S) 118 coupled to their control gates. The drain select gates 112, 113 are controlled by a drain select gate control line SG(D) 114.

Figure 2:
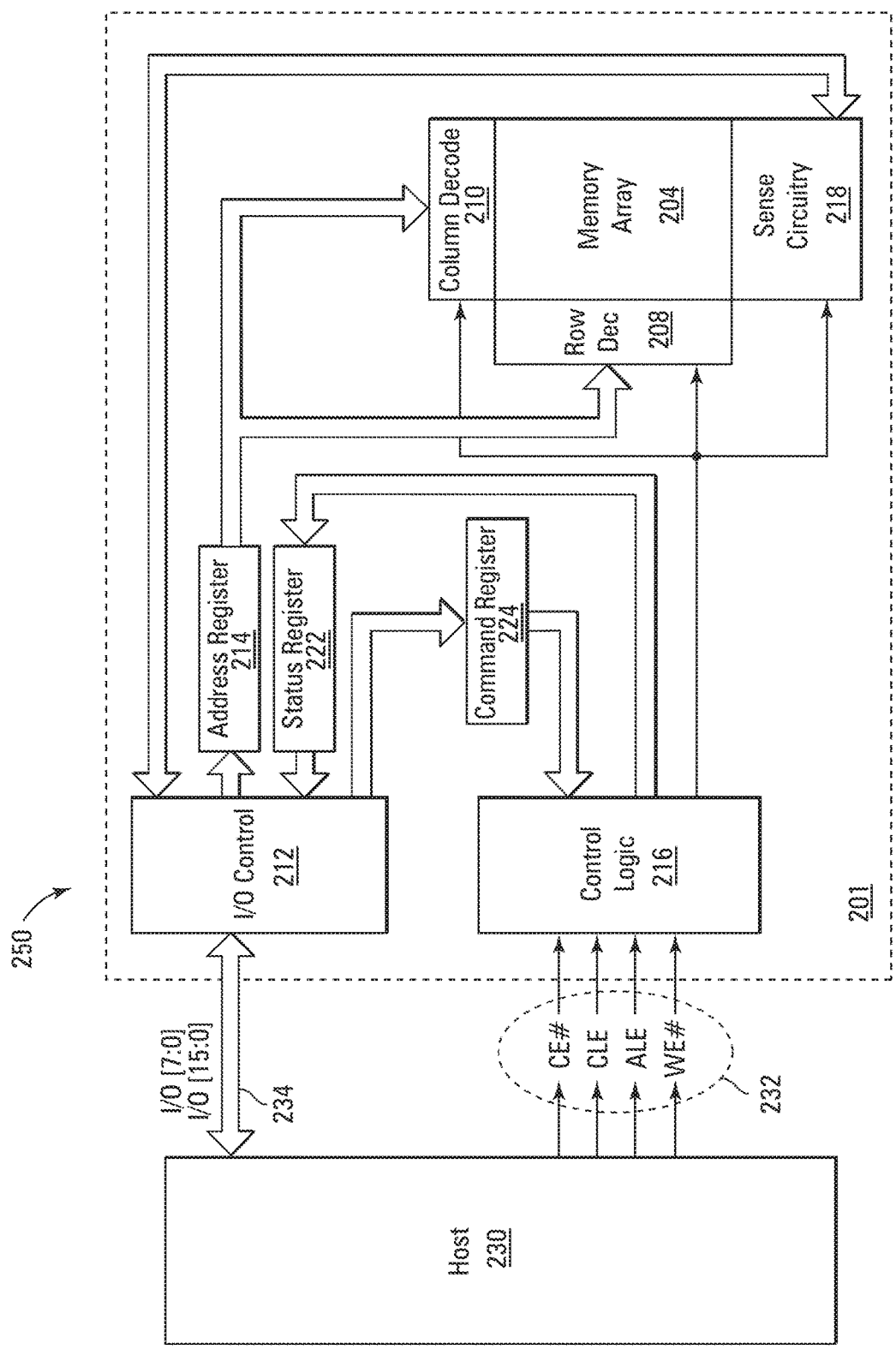
FIG. 2 is a block schematic of an electronic system in accordance with an embodiment of the disclosure.

FIG. 2 is a simplified block diagram of a memory device 201 according to an embodiment of the disclosure, and on which various embodiments of the disclosure can be practiced. Memory device 201 includes an array of memory cells 204 arranged in rows and columns. Although the various embodiments will be described primarily with reference to NAND memory arrays, the various embodiments are not limited to a specific architecture of the memory array 204. Some examples of other array architectures suitable for the present embodiments include NOR arrays, AND arrays, and virtual ground arrays. Further, the embodiments described herein are amenable for use with SLC and MLC memories without departing from the scope of the disclosure. Also, the methods are applicable for memories which could be read/sensed in analog format.

Row decode circuitry 208 and column decode circuitry 210 are provided to decode address signals provided to the memory device 201. Address signals are received and decoded to access memory array 204. Memory device 201 also includes input/output (I/O) control circuitry 212 to manage input of commands, addresses and data to the memory device 201 as well as output of data and status information from the memory device 201. An address register 214 is coupled between I/O control circuitry 212 and row decode circuitry 208 and column decode circuitry 210 to latch the address signals prior to decoding. A command register 224 is coupled between I/O control circuitry 212 and control logic 216 (which may include the elements and code of host 230) to latch incoming commands. In one embodiment, control logic 216, I/O control circuitry 212 and/or firmware or other circuitry can individually, in combination, or in combination with other elements, form an internal controller. As used herein, however, a controller need not necessarily include any or all of such components. In some embodiments, a controller can comprise an internal controller (e.g., located on the same die as the memory array) and/or an external controller. Control logic 216 controls access to the memory array 204 in response to the commands and generates status information for an external host such as a host 230. The control logic 216 is coupled to row decode circuitry 208 and column decode circuitry 210 to control the row decode circuitry 208 and column decode circuitry 210 in response to the received address signals.

A status register 222 is coupled between I/O control circuitry 212 and control logic 216 to latch the status information for output to an external controller.

Memory device 201 receives control signals at control logic 216 over a control link 232. The control signals may include a chip enable CE#, a command latch enable CLE, an address latch enable ALE, and a write enable WE#. Memory device 201 may receive commands (in the form of command signals), addresses (in the form of address signals), and data (in the form of data signals) from an external controller over a multiplexed input/output (I/O) bus 234 and output data to an external controller over I/O bus 234. I/O bus 234 is also used in one embodiment to signal physically to the host 230 that housekeeping is indicated.

In a specific example, commands are received over input/output (I/O) pins [7:0] of I/O bus 234 at I/O control circuitry 212 and are written into command register 224. The addresses are received over input/output (I/O) pins [7:0] of bus 234 at I/O control circuitry 212 and are written into address register 214. The data may be received over input/output (I/O) pins [7:0] for a device capable of receiving eight parallel signals, or input/output (I/O) pins [15:0] for a device capable of receiving sixteen parallel signals, at I/O control circuitry 212 and are transferred to sense circuitry (e.g., sense amplifiers and page buffers) 218. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 2 has been simplified to help focus on the embodiments of the disclosure.

Additionally, while the memory device of FIG. 2 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 234. Because the data signals represent bit patterns instead of individual bits, serial communication of an 8-bit data signal could be as efficient as parallel communication of eight signals representing individual bits.

Methods for programming may be performed in various embodiments on a memory such as memory device 201. Such methods are shown and described herein with reference to FIGS. 3-9.

Figure 3:
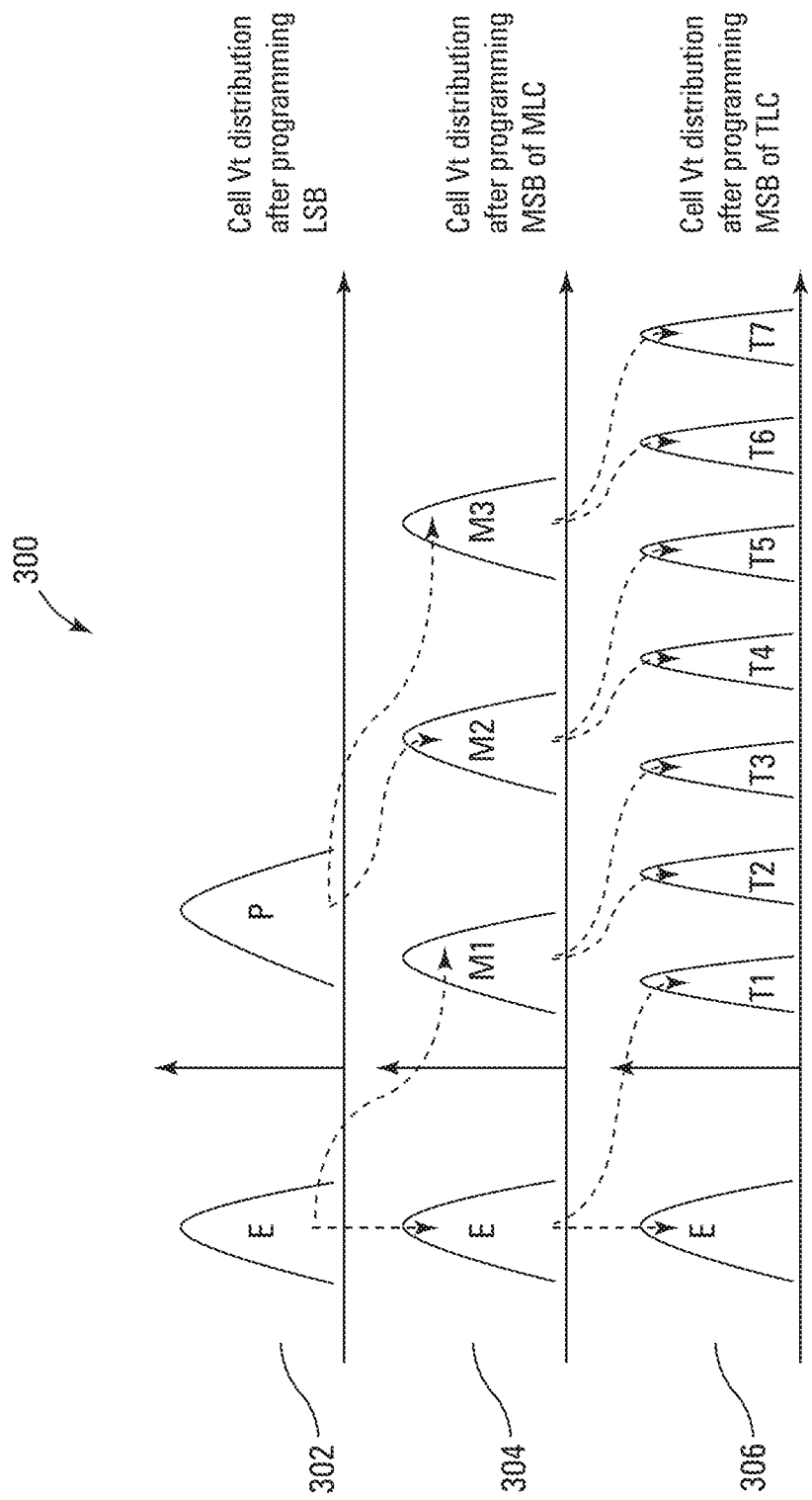
FIG. 3 is a diagram of typical data states for different types of memory cells.

FIG. 3 shows a distribution 302 showing two data states E and P (which may correspond to two final data states in a distribution of SLC cells or two intermediate data states in a distribution of MLC cells, such as after LSB programming). Distribution 304 shows four data states E, M1, M2 and M3 (which may correspond to four final data states in a distribution of two-level MLC cells or four intermediate data states in a distribution of higher level MLC cells). Distribution 306 shows eight data states E, T1, T2, T3, T4, T5, T6, T7 (which might correspond to eight final data states in a distribution of three-level MLC cells, such as after MSB programming). In the illustrated distributions, data state E corresponds to an "erased" data state (even though the cells in data state E may have received some "soft" programming after having been erased, as is performed in some algorithms, for purposes of this application they are still considered to be in an erased data state). Meanwhile, data states P, M1-M3 and T1-T7 correspond to "programmed" data states.

Figure 4:
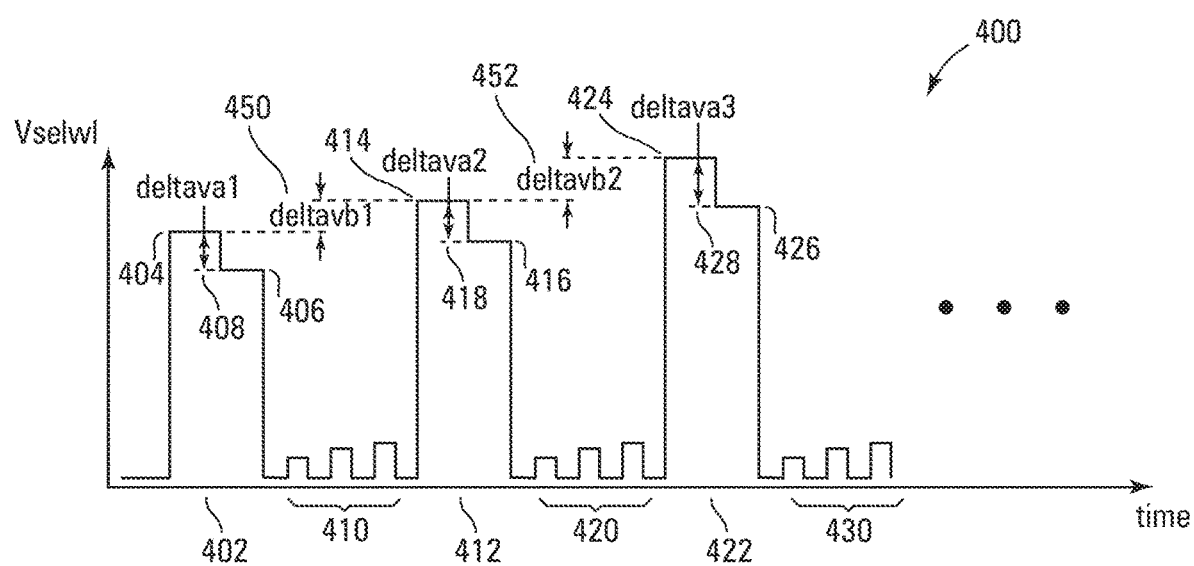
FIG. 4 is a diagram of a programming operation according to one embodiment of the present disclosure.

One embodiment 400 for programming an MLC is shown in FIG. 4. In this embodiment, each programming pulse 402, 412, 422, . . . , of a plurality of programming pulses has two voltage levels, starting at a first higher level 404, 414, 424, . . . , and stepping down to a second lower level 406, 416, 426, . . . . In one embodiment, the amount the multi-step pulses step down is 408, 418, and 428 for pulses 402, 412, and 422, respectively. The step-down amounts 408, 418, and 428 are device specific, and are chosen in one embodiment for the threshold voltage difference between data states. After each multi-step programming pulse, a plurality of verify pulses 410, 420, 430, . . . , are used to determine whether selected cells have reached their target data states. For further programming, the starting voltage for a next multi-step programming pulse is increased by an amount (450, 452) over the starting voltage of the previous multi-step programming pulse in one embodiment.

Figure 5:
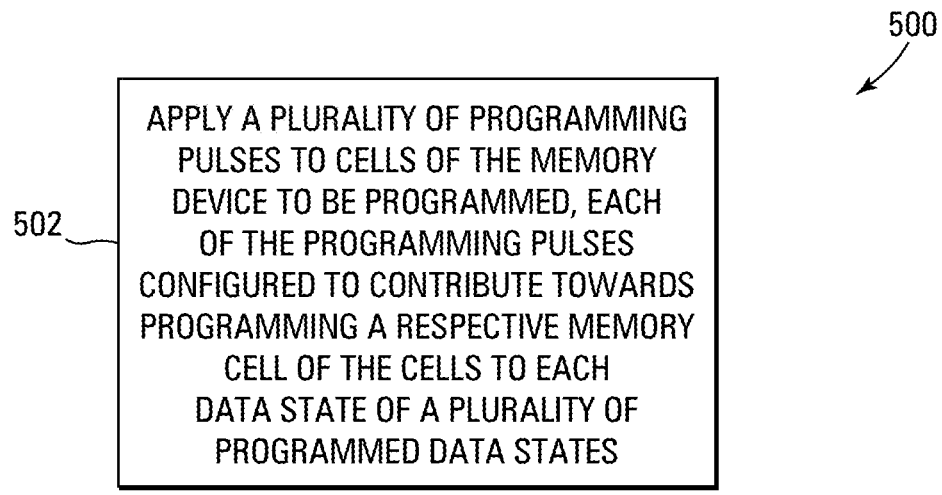
FIG. 5 is a flow chart diagram of a method according to one embodiment of the present disclosure.

In operation, and as shown in flow chart form in FIG. 5, programming 500 comprises applying a plurality of programming pulses to cells of the memory device to be programmed in block 502. Each of the plurality of programming pulses is configured to contribute towards programming a respective memory cell of the cells to each data state of a plurality of programmed data states. This is accomplished in one embodiment by providing a multi-step programming pulse. In one embodiment, each step of each of the plurality of programming pulses steps from a higher voltage to a lower voltage, and each step is configured to contribute towards programming a memory cell to at least one of the programmed data states. A single step down may be used, but additional steps may also be used.

For the portion of a multi-step programming pulse that is configured to contribute towards programming a memory cell(s) to a particular one (or more) of the programmed data states, the memory cells targeted for programming to one of the other programmed data states (that receive the programming pulse) are inhibited from programming. In at least one embodiment, cells being programmed to a data state associated with a higher threshold voltage level are inhibited differently than cells being programmed to a data state associated with a lower threshold voltage level. For example, a first portion of a multi-step pulse (e.g., portions corresponding to pulse levels 404, 414, 424), may be configured to contribute towards programming cells having a target data state of M2 or M3 while cells having a target data state of E or M1 are inhibited. Inhibiting the programming of cells having a target data state of E or M1 is accomplished in one embodiment by boosting channel voltages for those cells. A second portion of a multi-step pulse (e.g., portions corresponding to pulse levels 406, 416, 426), may be configured to contribute towards programming cells having a target data state of M1 while cells having a target data state of E, M2 or M3 are inhibited. Inhibiting the programming of cells having a target data state of E is again accomplished in one embodiment by boosting channel voltages for those cells. Inhibiting the programming of cells having a target data state of M2 or M3 is accomplished in one embodiment by reducing gate voltages (e.g., word line voltage) while boosting data line and channel voltages (e.g., to supply voltage, Vcc, minus Vth) for those cells.

Figure 6:
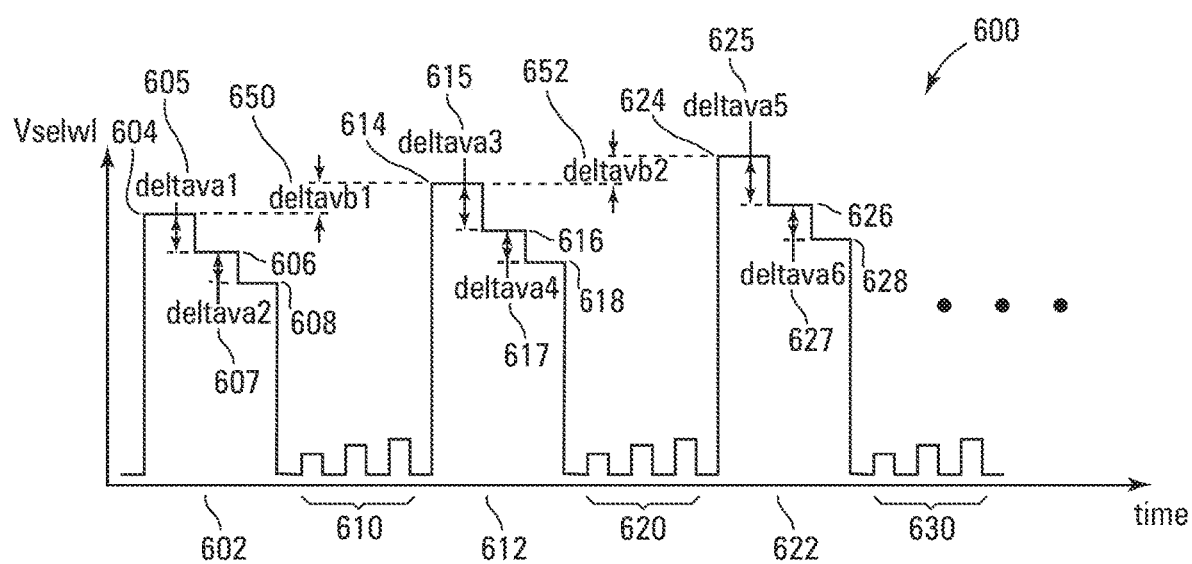
FIG. 6 is a diagram of a programming operation according to another embodiment of the present disclosure.

FIG. 6 shows one embodiment 600 of a different number of steps of a multi-step pulse being to program a memory cell(s) to one of four target data states: E, M1, M2 or M3. In this embodiment, each programming pulse 602, 612, 622, . . . , of a plurality of programming pulses has three voltage levels, starting at a first higher level 604, 614, 624, . . . , stepping down to a second level 606, 616, 626, . . . , and to a third level 608, 618, 628, . . . In one embodiment, the amount the multi-step pulses step down from the first level to the second level is 605, 615, 625, . . . , and the amount the multi-step pulses step down from the second level to the third level is 607, 617, 627, . . . , for pulses 602, 612, and 622, respectively. The step-down amounts are device specific, and are chosen in one embodiment for the threshold voltage difference between data states. After each multi-step programming pulse, a plurality of verify pulses 610, 620, 630, . . . , are used to determine whether selected cells have reached their target data states. For further programming, the starting voltage for a next multi-step programming pulse is increased by an amount (650, 652) over the starting voltage of the previous multi-step programming pulse in one embodiment. Pulse portions corresponding to pulse levels 604, 614, and 624 may be configured to contribute towards programming cells having a target data state of M3 while cells having a target data state of E, M1 or M2 are inhibited. Pulse portions corresponding to pulse levels 606, 616, and 626 may be configured to contribute towards programming cells having a target data state of M2 while cells having a target data state of E, M1 or M3 are inhibited. Pulse portions corresponding to pulse levels 608, 618, and 628 may be configured to contribute towards programming cells having a target data state of M1 while cells having a target data state of E, M2 or M3 are inhibited.

Figure 7:
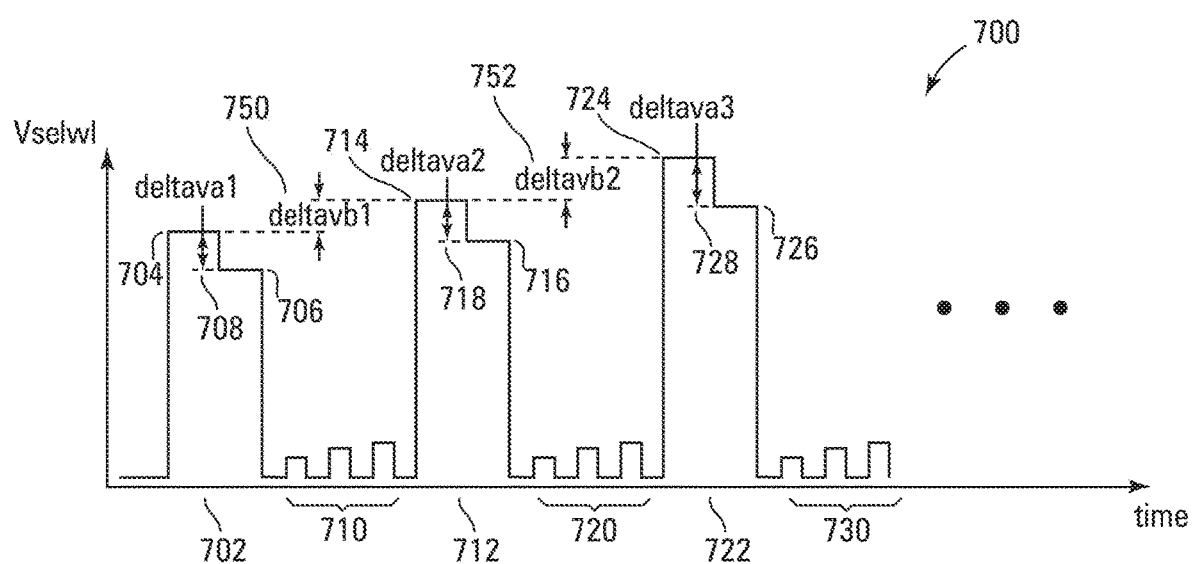
FIG. 7 is a diagram of a programming operation according to another embodiment of the present disclosure.

One embodiment 700 for programming a three level cell (TLC) is shown in FIG. 7. In this embodiment, each programming pulse 702, 712, 7422, . . . , of a plurality of programming pulses has two voltage levels, starting at a first higher level 704, 714, 724, . . . , and stepping down to a second lower level 706, 716, 726, . . . . In one embodiment, the amount the multi-step pulses step down is 708, 718, 728, . . . , for pulses 702, 712, and 722, respectively. The step-down amounts 708, 718, and 728 are device specific, and are chosen in one embodiment for the threshold voltage difference between data states. After each multi-step programming pulse, a plurality of verify pulses 710, 720, 730, . . . , are used to determine whether selected cells have reached their target data states. For further programming, the starting voltage for a next multi-step programming pulse is increased by an amount (750, 752) over the starting voltage of the previous multi-step programming pulse in one embodiment. The first portion of each multi-step pulse (e.g., portions corresponding to pulse levels 704, 714, 724) in this embodiment may be configured to contribute towards programming cells having a target data state in an upper half of the target data states (e.g., T4-T7) while cells having a target data state in a lower half of the target data states (e.g., E and T1-T3) are inhibited from programming, and the second portion of each multi-step pulse (e.g., portions corresponding to pulse levels 706, 716, 726) may be configured to contribute towards programming cells having a target data state in the lower half of the target data states (e.g., E and T1-T3), while cells having a target data state in the upper half of the target data states (e.g., T4-T7) are inhibited from programming.

Figure 8:
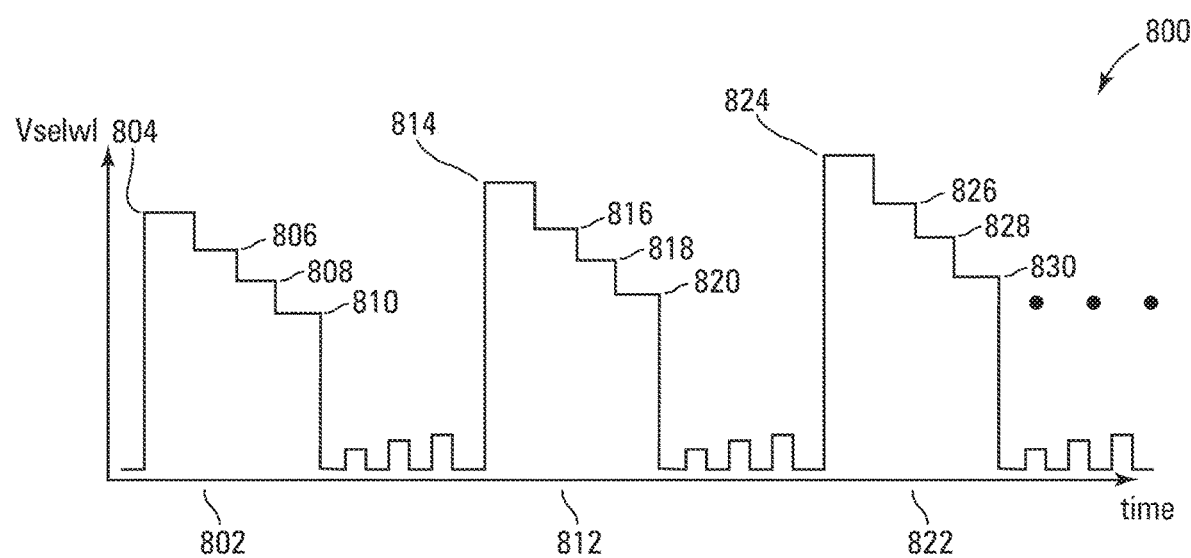
FIG. 8 is a diagram of a programming operation according to another embodiment of the present disclosure.

FIG. 8 shows one embodiment 800 of a different number of steps of a multi-step pulse being used to program a memory cell(s) to one of eight target data states: E, T1, T2, T3, T4, T5, T6 or T7). In this embodiment, each programming pulse 802, 812, 822, . . . , of a plurality of programming pulses has four voltage levels, starting at a first level 804, 814, 824, . . . , stepping down to a second level 806, 816, 826, . . . , to a third level 808, 818, 828, . . . , and to a fourth level 810, 820, 830. The step-down amounts, as described above, are device specific, and are chosen in one embodiment for the threshold voltage difference between data states. After each multi-step programming pulse, a plurality of verify pulses are used to determine whether selected cells have reached their targeted data states. For further programming, the starting voltage for a next multi-step programming pulse is increased by an amount (not shown) over the starting voltage of the previous multi-step programming pulse in one embodiment, all similarly to that shown above with respect to FIGS. 4, 6, and 7.

Figure 9:
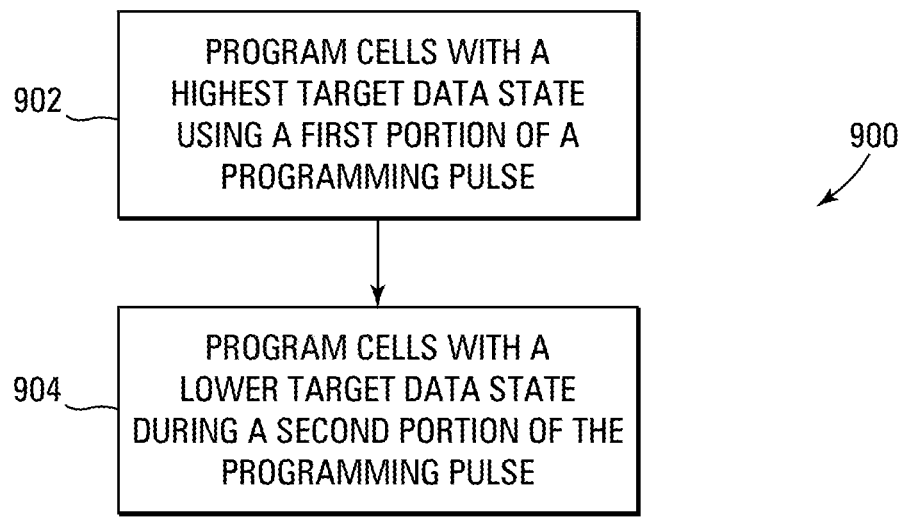
FIG. 9 is a flow chart diagram of a method according to another embodiment of the present disclosure.

Another method 900 for programming a multi-level cell is shown in FIG. 9. Method 900 comprises programming cells with a highest target data state (e.g., the data state associated with the highest threshold voltage level) using a first portion of a programming pulse in block 902, and after programming cells with a highest target data state in the first portion of the programming pulse, programming cells with a lower target data state during a second portion of the programming pulse in block 904. It should be understood that more than two levels may be used, as shown above with respect to FIGS. 5 and 8, without departing from the scope of the disclosure.

Figure 10:
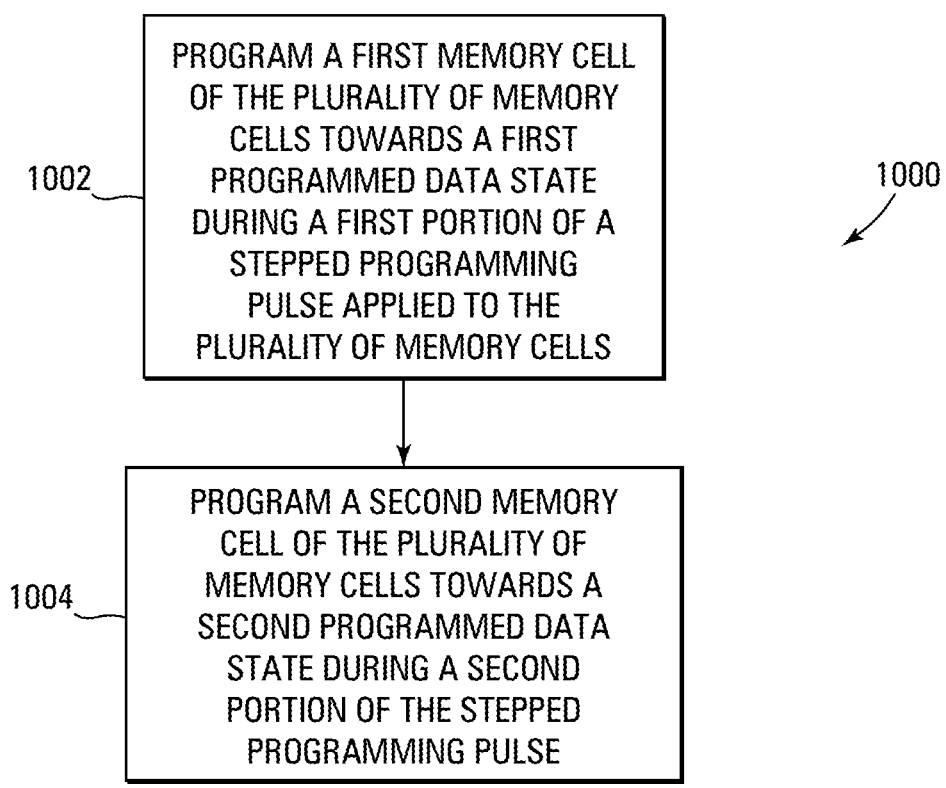
FIG. 10 is a flow chart diagram of a method according to another embodiment of the present disclosure.

Another method 1000 of programming a plurality of memory cells is shown in FIG. 10. Method 1000 comprises, in one embodiment, programming a first memory cell of the plurality of memory cells towards a first programmed data state (e.g., M2 or M3 as shown in FIG. 4; M3 as shown in FIG. 6; T4, T5, T6 or T7 as shown in FIG. 7; and T6 or T7 as shown in FIG. 8) during a first portion of a stepped programming pulse applied to the plurality of memory cells in block 1002, and programming a second memory cell of the plurality of memory cells towards a second programmed data state (e.g., M1 as shown in FIG. 4; M2 as shown in FIG. 6; T1, T2 or T3 as shown in FIG. 7; and T4 or T5 as shown in FIG. 8) during a second portion of the stepped programming pulse in block 1004.

Programming a first memory cell of the plurality of memory cells towards a first programmed data state during a first portion of a stepped programming pulse comprises in one embodiment programming a first number of memory cells of the plurality of memory cells towards the first programmed data state during the first portion of the stepped programming pulse, programming a second memory cell of the plurality of memory cells towards a second programmed data state during a second portion of the stepped programming pulse comprises programming a second number of memory cells of the plurality of memory cells towards the second programmed data state during the second portion of the stepped programming pulse. The stepped programming pulse is in one embodiment applied to an access line coupled to the plurality of memory cells.

Figure 11:
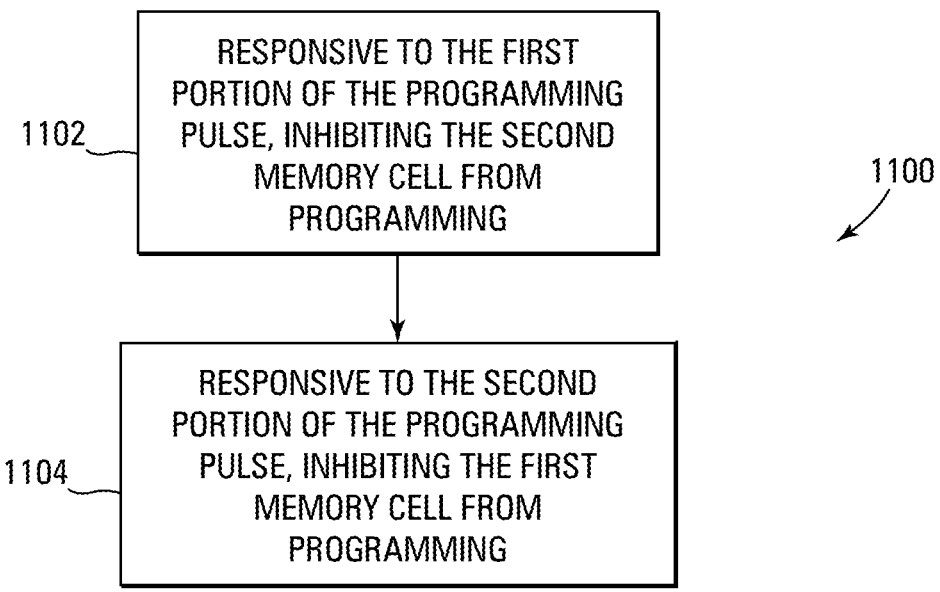
FIG. 11 is a flow chart diagram of a method according to another embodiment of the present disclosure.

In one embodiment, shown in FIG. 11, responsive to the first portion of the programming pulse, the second memory cell is inhibited from programming in block 1102, and responsive to the second portion of the programming pulse, the first memory cell is inhibited from programming in block 1104. The portions of the programming pulse are at different voltage levels, and in one embodiment the second voltage level is lower than the first voltage level. The first programmed data state is associated with a threshold voltage level that is higher than a threshold voltage level associated with the second programmed data state.

Figure 12:
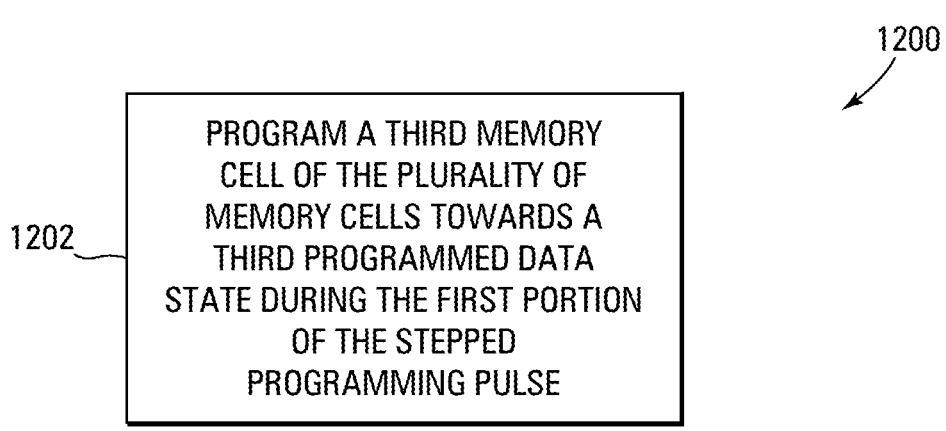
FIG. 12 is a flow chart diagram of a method according to another embodiment of the present disclosure.

The method 1000 may further comprise in an embodiment 1200 shown in FIG. 12, programming a third memory cell of the plurality of memory cells towards a third programmed data state (e.g., M3 as shown in FIG. 4; T5, T6 or T7 as shown in FIGS. 7; and T7 as shown in FIG. 8) during the first portion of the stepped programming pulse in block 1202. The third programmed data state is in one embodiment associated with a threshold voltage level that is higher than the threshold voltage level associated with the second programmed data state.

Figure 13:
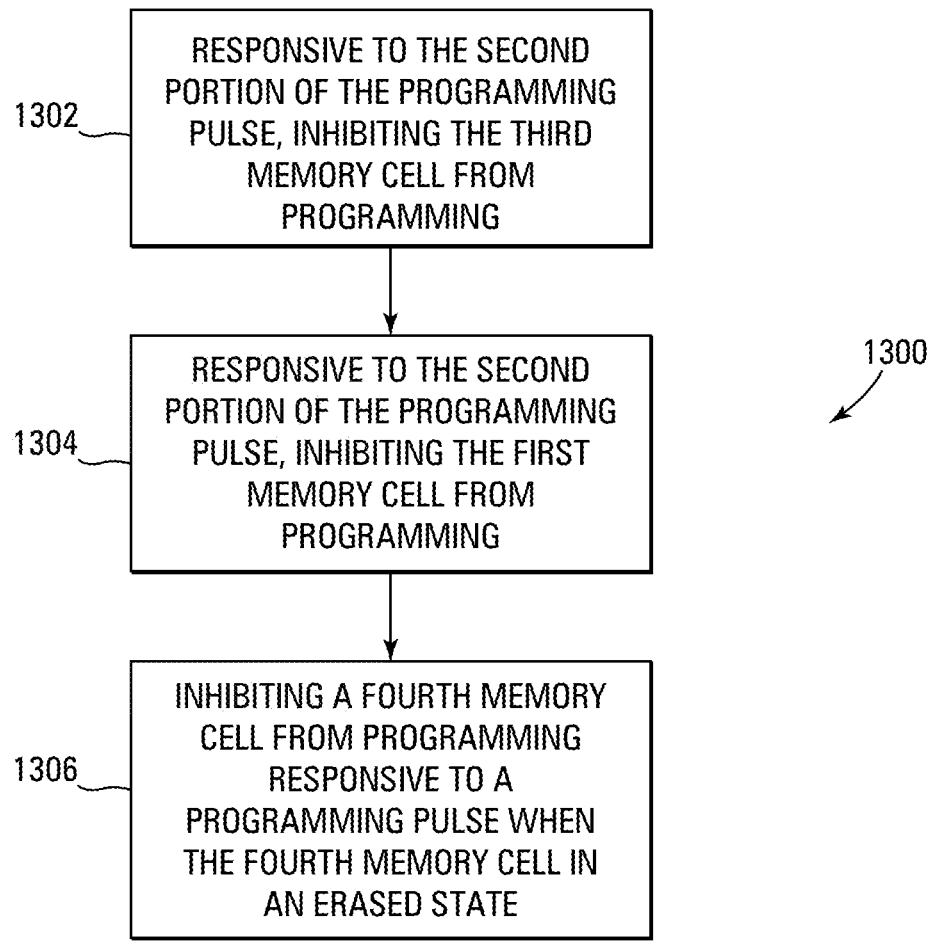
FIG. 13 is a flow chart diagram of a method according to another embodiment of the present disclosure.

In one embodiment 1300, shown in FIG. 13, the method 1200 further comprises, responsive to the second portion of the programming pulse, inhibiting the third memory cell from programming in block 1302, and responsive to the second portion of the programming pulse, inhibiting the first memory cell from programming in block 1304. A fourth memory cell is in this embodiment inhibited in block 1306 from programming responsive to a programming pulse when the fourth memory cell is in an erased state. Inhibiting the second memory cell from programming responsive to the first portion of the programming pulse comprises in one embodiment boosting a channel voltage of the second memory cell during the first portion of the programming pulse. Inhibiting the first and third memory cells from programming responsive to the second portion of the programming pulse comprises in one embodiment reducing a voltage level of the stepped programming pulse and increasing channel voltages of the first and third memory cells during the second portion of the programming pulse. Inhibiting the fourth memory cell from programming responsive to the programming pulse comprises in one embodiment boosting a channel voltage of the fourth memory cell.

Figure 14:
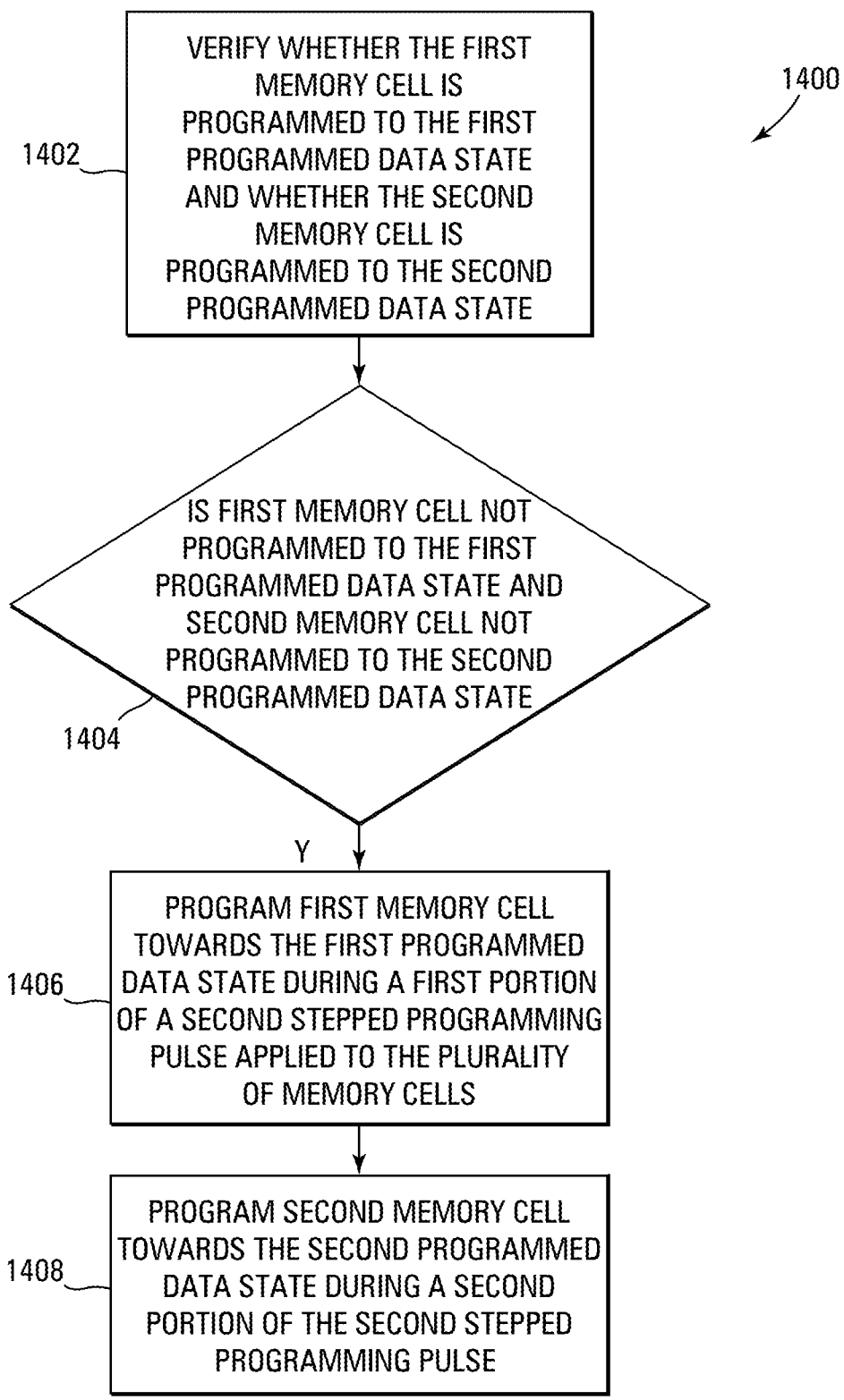
FIG. 14 is a flow chart diagram of a method according to another embodiment of the present disclosure.

The method 1000 may also include, in an embodiment 1400 shown in FIG. 14, verifying whether the first memory cell is programmed to the first programmed data state and whether the second memory cell is programmed to the second programmed data state in block 1402. It is determined in decision block 1404 if the first memory cell is not programmed to the first programmed data state and if the second memory cell is not programmed to the second programmed data state. If that is true, the first memory cell is programmed towards the first programmed data state during a first portion of a second stepped programming pulse applied to the plurality of memory cells in block 1406, and the second memory cell is programmed towards the second programmed data state during a second portion of the second stepped programming pulse in block 1408.

Figure 15:
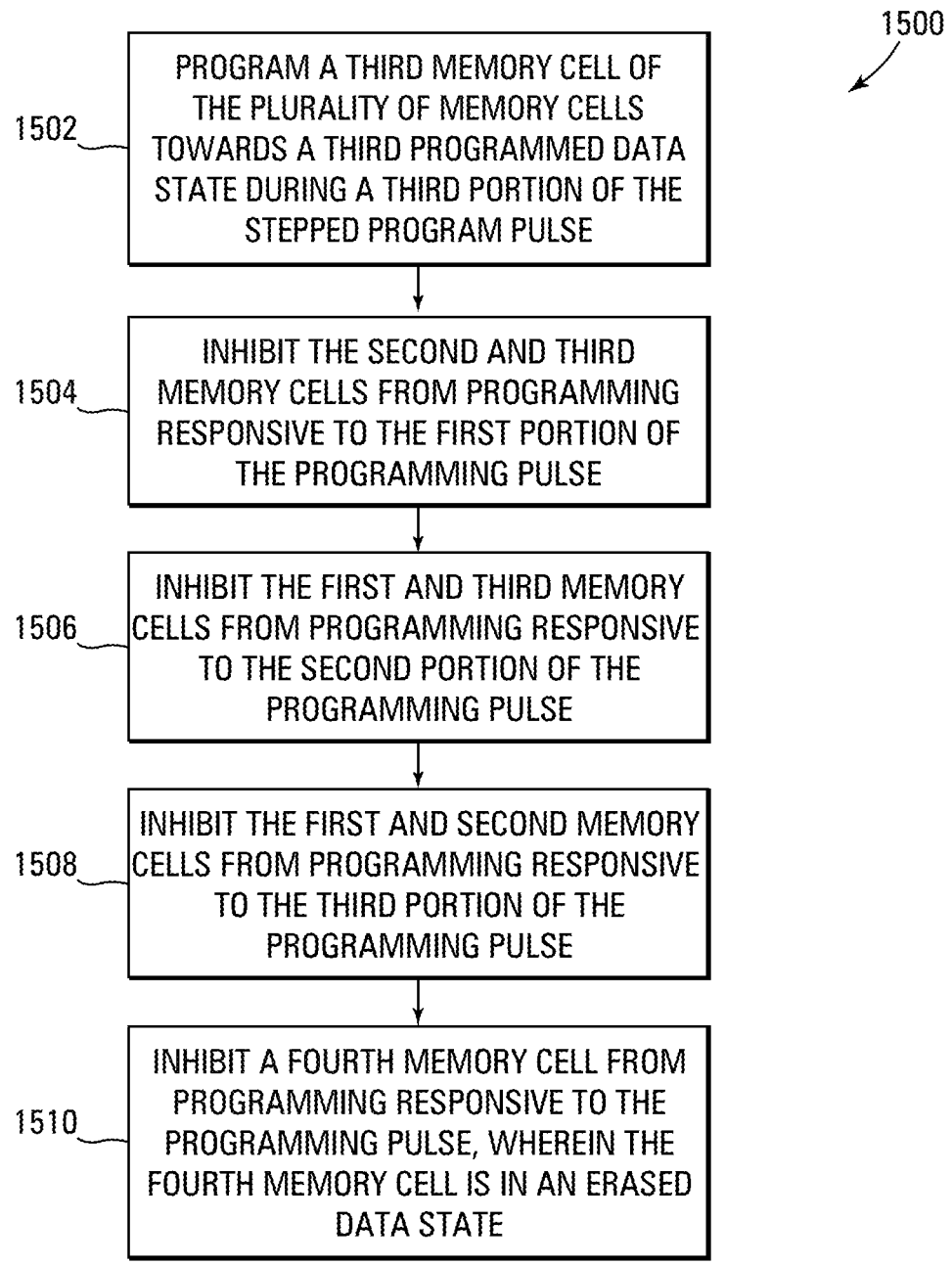
FIG. 15 is a flow chart diagram of a method according to another embodiment of the present disclosure.

The method 1000 may also comprise, in embodiment 1500 shown in FIG. 15, programming a third memory cell of the plurality of memory cells towards a third programmed data state (e.g., M1 as shown in FIG. 6; and T2 or T3 as shown in FIG. 8) during a third portion of the stepped programming pulse in block 1502. The programming pulse in this embodiment has a first voltage level during the first portion of the programming pulse, a second voltage level during the second portion of the programming pulse, and a third voltage level during the third portion of the programming pulse, wherein the third voltage level is lower than the second voltage level, wherein the second voltage level is lower than the first voltage level, wherein the first programmed data state is associated with a threshold voltage level that is higher than a threshold voltage level associated with the second programmed data state, and wherein the threshold voltage level associated with the second programmed data state is higher than a threshold voltage level associated with the third programmed data state.

The method of this embodiment may further comprise inhibiting the second and third memory cells from programming responsive to the first portion of the programming pulse in block 1504, inhibiting the first and third memory cells from programming responsive to the second portion of the programming pulse in block 1506, inhibiting the first and second memory cells from programming responsive to the third portion of the programming pulse in block 1508, and inhibiting a fourth memory cell from programming responsive to the programming pulse, wherein the fourth memory cell is in an erased data state in block 1510.

Inhibiting the second and third memory cells from programming responsive to the first portion of the programming pulse comprises boosting channel voltages of the second and third memory cells during the first portion of the programming pulse. Inhibiting the first and third memory cells from programming responsive to the second portion of the programming pulse comprises reducing a voltage level of the stepped programming pulse and increasing a channel voltage of the first memory cell during the second portion of the programming pulse, and boosting a channel voltage of the third memory cell during the second portion of the programming pulse. Inhibiting the first and second memory cells from programming responsive to the third portion of the programming pulse comprises reducing the voltage level of the stepped programming pulse and increasing channel voltages of the first and second memory cells during the third portion of the programming pulse. Inhibiting the fourth memory cell from programming responsive to the programming pulse comprises boosting a channel voltage of the fourth memory cell.

In this embodiment, the method may further comprise programming a fourth memory cell of the plurality of memory cells towards a fourth programmed data state (e.g., T1) during a fourth portion of the stepped programming pulse, programming a fifth memory cell of the plurality of memory cells towards a fifth programmed data state (e.g., T3) during the third portion of the stepped programming pulse, programming a sixth memory cell of the plurality of memory cells towards a sixth programmed data state (e.g., T5) during the second portion of the stepped programming pulse, and programming a seventh memory cell of the plurality of memory cells towards a seventh programmed data state (e.g., T7) during the first portion of the stepped programming pulse.

Figure 16:
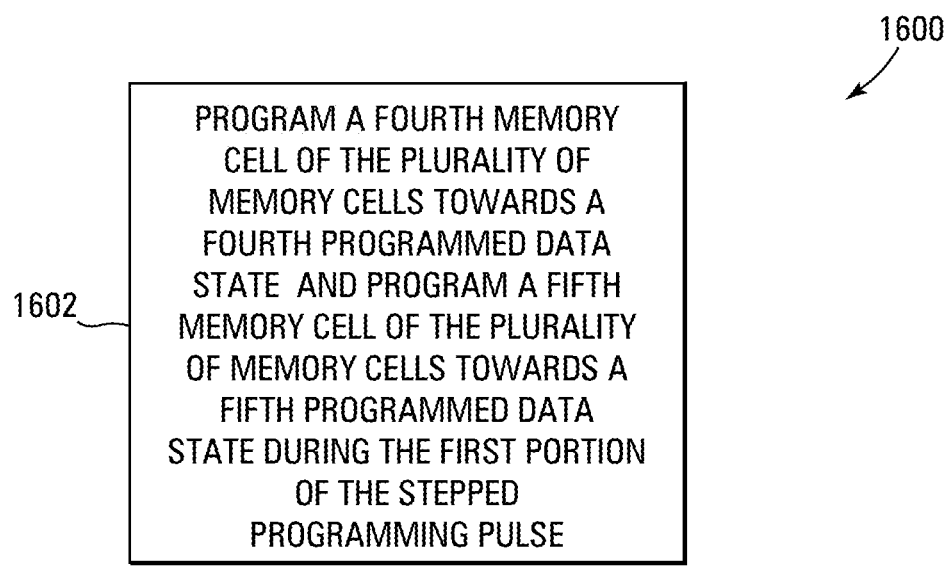
FIG. 16 is a flow chart diagram of a method according to another embodiment of the present disclosure.

The method 1200 may further comprise, in one embodiment 1600 shown in FIG. 16, programming a fourth memory cell of the plurality of memory cells towards a fourth programmed data state (FIG. 7->T6) and programming a fifth memory cell of the plurality of memory cells towards a fifth programmed data state (FIG. 7->T7) during the first portion of the stepped programming pulse in block 1602. The fourth programmed data state is associated with a threshold voltage level that is higher than the threshold voltage level associated with the third programmed data state, and the fifth programmed data state is associated with a threshold voltage level that is higher than the threshold voltage level associated with the fourth programmed data state.

With the embodiments of the present disclosure, the number of programming pulses used to program a memory is decreased. Further, the amount of power consumed in the programming process is also decreased since programming cells to multiple data states is accomplished without dis-charging and pumping up word lines between operations targeted towards programming cells having a respective specific target data state.

In a typical programming sequence a number of programming pulses for four-level MLC (four data states) is determined to be:

$$[(VgVt\max+M3Vt)-(VgVt\min+M1Vt)]/\text{step size}$$

where VgVt is the word line voltage—the threshold voltage, in one embodiment 20 Volts to program to a Vt of 4 Volts, making then VgVt=16. VgVtmax is the largest difference between word line voltage and desired threshold voltage, and VgVtmin is the smallest difference between word line voltage and desired threshold voltage.

The embodiments of the present disclosure may also reduce the amount of program disturb seen by M1 cells during programming of M2 and M3 cells, since M1 cells are programmed after M2 and M3 cells. Also, overall program disturb may be reduced since fewer program pulses and a shorter program time are used. Further, overall cell-to-cell coupling along a same word line may be reduced since cells targeted for programming are programmed together regardless of their targeted data state.

CONCLUSION

In summary, one or more embodiments of the disclosure show cells targeted for programming being programmed during each programming pulse. This is accomplished in one embodiment using a multi-step programming pulse that programs cells having a higher target data state with a first portion of the programming pulse and that contributes towards programming cells having a lower target data state during a second portion of the programming pulse.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of operating a memory device, comprising:
   applying a programming pulse to an access line coupled to control gates of a plurality of memory cells, wherein the programming pulse comprises a plurality of different voltage levels;
   enabling a particular memory cell of the plurality of memory cells for programming while the programming pulse has a particular voltage level of the plurality of different voltage levels, wherein the particular voltage level is configured to increase a threshold voltage of the particular memory cell when enabled for programming; and
   after enabling the particular memory cell for programming, inhibiting the particular memory cell from programming while the programming pulse has a second voltage level of the plurality of different voltage levels, different than the particular voltage level.

2. The method of claim 1, further comprising enabling a different memory cell for programming while the programming pulse has the second voltage level, wherein the second voltage level is configured to increase a threshold voltage of the different memory cell when enabled for programming.

3. The method of claim 2, further comprising inhibiting the different memory cell from programming while the programming pulse has the particular voltage level.

4. The method of claim 1, wherein inhibiting the particular memory cell from programming while the programming pulse has the second voltage level comprises inhibiting the particular memory cell from programming while the programming pulse has a voltage level lower than the particular voltage level.

5. The method of claim 1, further comprising:
enabling a different memory cell of the plurality of memory cells for programming while the programming pulse has the particular voltage level, wherein the particular voltage level is configured to increase a threshold voltage of the third memory cell when enabled for programming;
wherein the particular memory cell has a particular target programmed data state corresponding to a particular range of threshold voltages; and
wherein the different memory cell has a different target programmed data state corresponding to a different range of threshold voltages than the particular range of threshold voltages.

6. The method of claim 5, further comprising:
after applying the programming pulse, verifying whether the particular memory cell and the different memory cell have reached their respective target programmed data states;
wherein the different range of threshold voltages is lower than the particular range of threshold voltages.

7. The method of claim 1, wherein applying the programming pulse comprising the plurality of different voltage levels comprises applying the programming pulse comprising a number of different voltage levels less than or equal to a number of possible target programmed data states to which the memory device is configured to program a memory cell of the plurality of memory cells while applying the programming pulse.

8. The method of claim 1, further comprising enabling any memory cell of the plurality of memory cells for programming during only one voltage level of the plurality of different voltage levels of the programming pulse.

9. The method of claim 8, further comprising inhibiting at least one memory cell of the plurality of memory cells from programming during each voltage level of the plurality of different voltage levels of the programming pulse.

10. The method of claim 1, further comprising:
enabling a different memory cell of the plurality of memory cells for programming while the programming pulse has the second voltage level, wherein the second voltage level is configured to increase a threshold voltage of the different memory cell when enabled for programming.

11. The method of claim 10, further comprising:
after enabling the different memory cell for programming, inhibiting the different memory cell from programming while the programming pulse has a third voltage level of the plurality of different voltage levels, different than the particular voltage level and different than the second voltage level; and
enabling a third memory cell of the plurality of memory cells for programming while the programming pulse has the third voltage level, wherein the third voltage level is configured to increase a threshold voltage of the third memory cell when enabled for programming.

12. A method of operating a memory device, comprising:
applying a programming pulse to an access line coupled to control gates of a plurality of memory cells, wherein the programming pulse comprises a plurality of different voltage levels;
enabling a particular memory cell of the plurality of memory cells for programming while the programming pulse has a particular voltage level of the plurality of different voltage levels, wherein the particular voltage level is configured to increase a threshold voltage of the particular memory cell when enabled for programming; and
inhibiting a different memory cell of the plurality of memory cells from programming while the programming pulse has the particular voltage level, and enabling the different memory cell for programming while the programming pulse has a second voltage level of the plurality of different voltage levels, wherein the second voltage level is lower than the particular voltage level, and wherein the second voltage level is configured to increase a threshold voltage of the different memory cell when enabled for programming.

13. The method of claim 12, further comprising:
enabling a third memory cell of the plurality of memory cells for programming while the programming pulse has the particular voltage level, wherein the particular voltage level is configured to increase a threshold voltage of the third memory cell when enabled for programming;
wherein the particular memory cell has a particular target data state corresponding to a particular range of threshold voltages; and
wherein the third memory cell has a different target data state corresponding to a different range of threshold voltages than the particular range of threshold voltages.

14. The method of claim 12, further comprising:
inhibiting a third memory cell of the plurality of memory cells from programming while the programming pulse has the particular voltage level and while the programming pulse has the second voltage level, and enabling the third memory cell for programming while the programming pulse has a third voltage level of the plurality of different voltage levels, wherein the third voltage level is different than the particular voltage level and different than the second voltage level, and wherein the third voltage level is configured to increase a threshold voltage of the third memory cell when enabled for programming.

15. The method of claim 12, wherein applying the programming pulse to the access line comprises applying the second voltage level to the access line subsequent to applying the particular voltage level to the access line.

16. A method of operating a memory device, comprising:
applying a programming pulse to an access line coupled to control gates of a plurality of memory cells, wherein the programming pulse comprises a plurality of steps, and wherein each step of the plurality of steps has a respective voltage level of a plurality of different voltage levels;
enabling a particular memory cell of the plurality of memory cells for programming during a particular step of the plurality of steps of the programming pulse, wherein the respective voltage level of the particular step of the programming pulse is configured to increase a threshold voltage of the particular memory cell when enabled for programming; and inhibiting a different memory cell of the plurality of memory cells from programming during the particular step of the programming pulse, and enabling the different memory cell for programming during a subsequent step of the plurality of steps of the programming pulse, wherein the respective voltage level of the subsequent step of the programming pulse is configured to increase a threshold voltage of the different memory cell when enabled for programming.

17. The method of claim 16, further comprising:
enabling a third memory cell of the plurality of memory cells for programming during a next subsequent step of the plurality of steps of the programming pulse, wherein the respective voltage level of the next subsequent step of the programming pulse is configured to increase a threshold voltage of the third memory cell when enabled for programming;
inhibiting the particular memory cell from programming during the subsequent step of the programming pulse and during the next subsequent step of the programming pulse;
inhibiting the different memory cell from programming during the next subsequent step of the programming pulse; and
inhibiting the third memory cell from programming during the particular step of the programming pulse and during the subsequent step of the programming pulse.

18. The method of claim 17, further comprising inhibiting a fourth memory cell of the plurality of memory cells from programming during the particular step of the programming pulse, during the subsequent step of the programming pulse, and during the next subsequent step of the programming pulse.

19. The method of claim 16, further comprising:
enabling a third memory cell of the plurality of memory cells for programming during the particular step of the programming pulse, wherein the respective voltage level of the particular step of the programming pulse is configured to increase a threshold voltage of the third memory cell when enabled for programming;
inhibiting the particular memory cell from programming during the subsequent step of the programming pulse; and
inhibiting the third memory cell from programming during the subsequent step of the programming pulse;
wherein a target programmed data state of the third memory cell is different than a target programmed data state of the particular memory cell.

20. The method of claim 19, wherein enabling the different memory cell for programming during the subsequent step of the programming pulse comprises enabling the different memory cell for programming toward a target programmed data state corresponding to a threshold voltage level that is lower than a threshold voltage level corresponding to the target programmed data state of the particular memory cell and lower than a threshold voltage level corresponding to the target programmed data state of the third memory cell.

* * * * *